United States Patent
Nada et al.

(10) Patent No.: US 10,374,107 B2
(45) Date of Patent: Aug. 6, 2019

(54) OPTICAL WAVEGUIDE INTEGRATED LIGHT RECEIVING ELEMENT AND METHOD OF MANUFACTURING THE SAME

(71) Applicant: NIPPON TELEGRAPH AND TELEPHONE CORPORATION, Tokyo (JP)

(72) Inventors: Masahiro Nada, Tokyo (JP); Yoshifumi Muramoto, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/093,133

(22) PCT Filed: Apr. 14, 2017

(86) PCT No.: PCT/JP2017/015244
§ 371 (c)(1),
(2) Date: Oct. 11, 2018

(87) PCT Pub. No.: WO2017/183568
PCT Pub. Date: Oct. 26, 2017

(65) Prior Publication Data
US 2019/0157472 A1    May 23, 2019

(30) Foreign Application Priority Data
Apr. 19, 2016   (JP) .................. 2016-083455

(51) Int. Cl.
*G02B 6/12*    (2006.01)
*G02B 6/13*    (2006.01)
(Continued)

(52) U.S. Cl.
CPC .......... *H01L 31/02327* (2013.01); *G02B 6/12* (2013.01); *G02B 6/13* (2013.01);
(Continued)

(58) Field of Classification Search
CPC ............ H01L 31/1868; H01L 31/0232; H01L 31/103; H01L 31/105; H01L 31/107;
(Continued)

(56) References Cited

U.S. PATENT DOCUMENTS

| 10,134,937 B2* | 11/2018 | Runge ............... G02B 6/12004 |
| 2009/0321868 A1* | 12/2009 | Nakaji ................ H01L 31/105 257/458 |
| 2015/0241648 A1 | 8/2015 | Kikuchi et al. |

FOREIGN PATENT DOCUMENTS

| JP | H04-286168 A | 10/1992 |
| JP | H06-140658 A | 5/1994 |
| JP | 2015-162576 A | 9/2015 |

OTHER PUBLICATIONS

J.C. Campbell, "Recent Advances in Telecommunications Avalanche Photodiodes", Journal of Lightwave Technology, vol. 25, No. 1, pp. 109-121, 2007.
(Continued)

*Primary Examiner* — Michael P Mooney
(74) *Attorney, Agent, or Firm* — Womble Bond Dickinson (US) LLP

(57) ABSTRACT

An optical waveguide integrated light receiving element includes an optical waveguide (105) arranged on a side of a second contact layer (102) opposite to a side where a light absorption layer (103) is arranged, having a waveguide direction parallel to a plane of the light absorption layer (103), and optically coupled with the second contact layer (102). The second contact layer (102) has, in a planar view, a size of an area smaller than that of the light absorption
(Continued)

layer (103) and arranged inside the light absorption layer (103).

5 Claims, 3 Drawing Sheets

(51) Int. Cl.
| G02B 6/42 | (2006.01) |
| H01L 31/18 | (2006.01) |
| H01L 31/107 | (2006.01) |
| H01L 31/0216 | (2014.01) |
| H01L 31/0232 | (2014.01) |
| H01L 31/0304 | (2006.01) |

(52) U.S. Cl.
CPC ...... *G02B 6/4295* (2013.01); *H01L 31/02161* (2013.01); *H01L 31/03046* (2013.01); *H01L 31/1075* (2013.01); *H01L 31/1844* (2013.01); *H01L 31/1868* (2013.01)

(58) Field of Classification Search
CPC ... H01L 31/165; H01L 31/02325; G02B 6/12; G02B 6/4295; G02B 6/13
USPC .... 385/14, 32, 129, 130; 257/186, 192, 432, 257/466, 214.1, 216, 227.11
See application file for complete search history.

(56) References Cited

OTHER PUBLICATIONS

N. Yasuoka et al., "High-speed and high-efficiency InP/InGaAs waveguide avalanche photodiodes for 40 Gbit/s transmission systems", Optical Fiber Communication Conference 2004, vol. 25, TuM2, 2004.

K. Kato et al., "22GHz Photodiode Monolithically Integrated with Optical Waveguide on Semi-Insulating InP using Novel Butt-Joint Structure", Electronics Letters, vol. 28, No. 12, pp. 1140-1142, 1992.

H. Sudo and M. Suzuki, "Surface Degradation Mechanism of InP/InGaAs APD's", Journal of Lightwave Technology, vol. 6, No. 10, pp. 1496-1501, 1988.

M. Nada, Y. Muramoto, H. Yokoyama, T. Ishibashi, and H. Matsuzaki, "Triple-mesa Avalanche Photodiode With Inverted P-Down Structure for Reliability and Stability", Journal of Lightwave Technology, vol. 32, No. 8, pp. 1543-1548, 2014.

E. Yagyu et al., "Simple Planar Structure for High-Performance AlInAs Avalanche Photodiodes", IEEE Photonics Technology Letters, vol. 18, No. 1, pp. 76-78, 2006.

M. Nada, T. Hoshi, H. Yamazaki, T. Hashimoto, and H. Matsuzaki, "Linearity improvement of high-speed avalanche photodiodes using thin depleted absorber operating with higher order modulation format", Optics Express, vol. 23, No. 21, pp. 27715-27723, 2015.

International Search Report and Written Opinion received for PCT Patent Application No. PCT/JP2017/015244, dated Jun. 20, 2017, 10 pages (5 Pages of English Translation and 5 Pages of Original Document).

International Preliminary Report on Patentability received for PCT Patent Application No. PCT/US2012/062874, dated Nov. 1, 2018, 9 pages (4 Pages of English Translation and 5 pages of Original Document).

* cited by examiner

OPTICAL WAVEGUIDE INTEGRATED LIGHT RECEIVING ELEMENT AND METHOD OF MANUFACTURING THE SAME

TECHNICAL FIELD

The present invention relates to an optical waveguide integrated light receiving element in which an optical waveguide and a light receiving element are integrated, and a method of manufacturing the same.

BACKGROUND ART

A general optical receiver in optical communication normally includes a light receiving element such as a photodiode (PD) or an avalanche photodiode (APD) configured to convert incident light into a current, and a trans-impedance amplifier configured to amplify the photocurrent generated by the light receiving element. In the light receiving elements, the upper limit of the photoelectric conversion efficiency of the PD is 100% in terms of quantum efficiency. On the other hand, the APD has a function of accelerating, under a high electric field, photoelectrons generated in the element and thus colliding them against a lattice to ionize, thereby amplifying the carrier. For this reason, in the APD, a plurality of carriers are output in correspondence with one photon. Hence, the APD can obtain a sensitivity more than 100% in terms of quantum conversion efficiency, and is applied to a high-sensitivity optical receiver (non-patent literature 1).

A general structure of the APD is a "vertical illumination structure" in which light enters from the upper surface or the lower surface (substrate side) of the element. In the APD, the light responsivity and the operation speed substantially hold a trade-off relationship. That is, in the vertical illumination structure, to increase the light responsivity, a light absorption layer needs to be thick. However, when the light absorption layer is made thicker, electrons and holes generated in the light absorption layer by light reception need to travel a longer distance, and therefore, the characteristic in a high frequency domain lowers. In the "vertical illumination type", the trade-off between the light responsivity and the operation speed particularly becomes conspicuous.

For the purpose of relaxing the above-described trade-off, an "optical waveguide type" APD has been proposed (non-patent literature 2). In the optical waveguide type APD, the traveling direction of a light wave in the light absorption layer is perpendicular to the crystal growing direction and the transport direction of the carrier. Since the transport distance of the carrier and the penetration length of the light wave in the light absorption layer are independent in the optical waveguide type APD, the trade-off between the light responsivity and the operation speed observed in the vertical illumination type is much less strict. Such a feature of the optical waveguide type is useful not only in the APD but also in a PD. Hence, the optical waveguide type is used in the PD that requires a high speed/high sensitivity.

In the optical waveguide type light receiving element, optical coupling between the optical waveguide and the light absorption layer needs to be implemented such that signal light propagates through the optical waveguide and then finally enters the light absorption layer. Several methods have been proposed to implement the optical coupling. In, for example, a "butt coupling type", optical coupling between the optical waveguide and the light absorption layer is implemented by making the optical waveguide and the light absorption layer abut against each other (see non-patent literature 3). In the butt coupling type, a high coupling efficiency can be obtained. However, there is a risk that current concentration occurs due to abrupt light absorption near the optical coupling interface between the light absorption layer and the optical waveguide. On the other hand, there exists an "evanescent coupling type" in which the optical waveguide and the light absorption layer are spatially separated, and the material system between the optical waveguide and the light absorption layer is appropriately designed, thereby implementing optical coupling between the optical waveguide and the light absorption layer using the propagation of an evanescent wave. According to the evanescent coupling type, the concentration of the photocurrent can be relaxed as compared to the butt coupling type.

By the way, to ensure the reliability of the operation in a long term to apply the APD to an actual optical receiver, it is important to inhibit generation of an electric field on an element side surface of the APD (see non-patent literature 4). This is associated with generating a very high electric field inside the element in the APD, unlike a general (conventional) PD. In the general PD, the operating voltage is about 3 V, and the field in the element need only be several ten kV/cm at which the carrier reaches the saturation speed.

On the other hand, in the APD, when ensuring a large operating voltage range and operating the APD with a high gain, an electric field of 2 to 300 kV/cm is invoked in the light absorption layer, and an electric field of 600 kV/cm or more is invoked in the multiplication layer. When such a strong electric field is generated on the element side surface of the APD, lowering of reliability caused by material degradation on the element side surface causes a problem. Hence, in the APD, confining the electric field inside the element is a necessary condition for practical use. For this purpose, an inverted APD or a planar APD has been proposed (see non-patent literatures 5 and 6).

RELATED ART LITERATURE

Non-Patent Literature

Non-Patent Literature 1: J. C. Campbell, "Recent Advances in Telecommunications Avalanche Photodiodes", Journal of Lightwave Technology, vol. 25, no. 1, pp. 109-121, 2007.

Non-Patent Literature 2: N. Yasuoka et al., "High-speed and high-efficiency InP/InGaAs waveguide avalanche photodiodes for 40 Gbit/s transmission systems", Optical Fiber Communication Conference 2004, vol. 25, TuM2, 2004.

Non-Patent Literature 3: K. Kato et al., "22 GHz Photodiode Monolithically Integrated with Optical Waveguide on Semi-Insulating InP using Novel Butt-Joint Structure", Electronics Letters, vol. 28, no. 12, pp. 1140-1142, 1992.

Non-Patent Literature 4: H. Sudo and M. Suzuki, "Surface Degradation Mechanism of InP/InGaAs APD's", Journal of Lightwave Technology, vol. 6, no. 10, pp. 1496-1501, 1988.

Non-Patent Literature 5: M. Nada, Y. Muramoto, H. Yokoyama, T. Ishibashi, and H. Matsuzaki, "Triple-mesa Avalanche Photodiode With Inverted P-Down Structure for Reliability and Stability", Journal of Lightwave Technology, vol. 32, no. 8, pp. 1543-1548, 2014.

Non-Patent Literature 6: E. Yagyu et al., "Simple Planar Structure for High-Performance AlInAs Avalanche Photodiodes", IEEE PHOTONICS TECHNOLOGY LETTERS, vol. 18, no. 1, pp. 76-78, 2006.

Non-Patent Literature 7: M. Nada, T. Hoshi, H. Yamazaki, T. Hashimoto, and H. Matsuzaki, "Linearity improvement of high-speed avalanche photodiodes using thin depleted absorber operating with higher order modulation format", Optics Express, vol. 23, no. 21, pp. 27715-27723, 2015.

DISCLOSURE OF INVENTION

Problem to be Solved by the Invention

However, as described above, if the APD has the structure for confining an electric field inside, and an optical waveguide type APD is applied to this to implement a high speed/high sensitivity, a loss occurs. This will be described below with reference to FIG. 5. FIG. 5 is a sectional view showing the arrangement of an optical waveguide type light receiving element in which an optical waveguide is combined with an APD having a structure (inverted type) that confines an electric field inside the element. This example assumes optical coupling by propagation of an evanescent wave.

In this light receiving element, an optical waveguide 502 is formed on a substrate 501, and a p-type contact layer 503, a light absorption layer 504, a p-type field control layer 505, a multiplication layer 506, an n-type field control layer 507, an electron transit layer 508, and an n-type contact layer 509 are formed on the optical waveguide 502. The optical waveguide 502 includes a core 521 and a clad 522 which are made of a semiconductor such as silicon. In the optical waveguide 502, signal light is guided in the left-to-right direction of the sheet surface of FIG. 5. Optical coupling between the optical waveguide 502 and the light absorption layer 504 is implemented by propagation of the evanescent wave. Note that an electrode connected to the p-type contact layer 503 and an electrode connected to the n-type contact layer 509 are not illustrated.

Here, the n-type contact layer 509 is, in a planar view, formed to have an area smaller than that of the mesa of the electron transit layer 508 and a mesa including the light absorption layer 504. When the n-type contact layer 509 is formed to be smaller than the other layers in the planar view, the electric field is confined, and no electric field is generated in a peripheral region 510 around the n-type contact layer 509 in the planar view. With this arrangement, in the light absorption layer 504, a photocarrier generated by light absorption in the peripheral region 510 does not drift. The photocarrier does not become a carrier (effective carrier) effective for the operation of the APD and simply behaves as a loss in photoelectric conversion. In this structure, only the photocarrier generated in a region of the light absorption layer 504 immediately under the n-type contact layer 509 behaves as the effective carrier.

In the field confinement structure, the light that has entered from the optical waveguide 502 into the light absorption layer 504 via the contact layer 503 is not necessarily entirely used for photoelectric conversion because of the existence of the peripheral region 510 to which no electric field is applied. Here, the light that has entered from the optical waveguide 502 into the light absorption layer 504 is a waveguide loss for the optical waveguide 502. However, when the light is entirely photoelectrically converted, no loss occurs as a whole. Conversely, in a state in which it cannot be said that the light is not entirely used for photoelectric conversion because of the existence of the peripheral region, as described above, a loss occurs as a whole.

The above-described loss is a loss that can occur not only in a case in which an inverted APD is used as the element portion of the APD but also in a case in which a planar APD is used as long as the APD has a structure that enables field confinement, and becomes a factor that makes it difficult to increase the sensitivity of the optical waveguide type APD. When the field confinement structure is not used to improve the sensitivity of the optical waveguide type APD, it is difficult to ensure reliability.

The present invention has been made to solve the above-described problems, and has as its object to suppress a loss in an optical waveguide type photodiode having a field confinement structure.

Means of Solution to the Problem

According to the present invention, there is provided an optical waveguide integrated light receiving element including a first contact layer made of a compound semiconductor of a first conductivity type, a second contact layer made of a compound semiconductor of a second conductivity type, a light absorption layer made of a compound semiconductor and formed between the first contact layer and the second contact layer, a multiplication layer made of a compound semiconductor and formed between the light absorption layer and one of the first contact layer and the second contact layer, and an optical waveguide arranged on a side of the second contact layer opposite to a side where the light absorption layer is arranged, having a waveguide direction parallel to a plane of the light absorption layer, and optically coupled with the second contact layer, wherein the second contact layer has, in a planar view, a size of an area smaller than that of the light absorption layer and arranged inside the light absorption layer in the planar view.

The optical waveguide integrated light receiving element may further comprise an optical matching layer of the second conductivity type that is formed in contact with the side of the second contact layer where the light absorption layer is arranged, and an impurity concentration of the optical matching layer may be not more than an impurity concentration of the second contact layer.

The optical waveguide integrated light receiving element may further comprise a passivation layer configured to cover a side portion of a light receiving element including the first contact layer, the second contact layer, the light absorption layer, and the multiplication layer, and the passivation layer has a refractive index lower than that of a semiconductor that forms the light receiving element.

According to the present invention, there is provided a method of manufacturing an optical waveguide integrated light receiving element, including a first step of producing, on a substrate, a light receiving element including a first contact layer made of a compound semiconductor of a first conductivity type, a second contact layer made of a compound semiconductor of a second conductivity type, a light absorption layer made of a compound semiconductor and formed between the first contact layer and the second contact layer, and a multiplication layer made of a compound semiconductor and formed between the light absorption layer and one of the first contact layer and the second contact layer, wherein the second contact layer has, in a planar view, a size of an area smaller than that of the light absorption layer, and arranged inside the light absorption layer, a second step of producing an optical waveguide substrate including an optical waveguide, and a third step of wafer-bonding the substrate and the optical waveguide substrate and obtaining a state in which the optical waveguide is arranged on a side of the second contact layer opposite to a side where the light absorption layer is arranged, has a waveguide direction parallel to a plane of the light absorption layer, and is optically coupled with the second contact layer.

Effect of the Invention

As described above, according to the present invention, the second contact layer arranged on the side of the optical waveguide has, in a planar view, a size of an area smaller than that of the light absorption layer, and arranged inside the light absorption layer. It is therefore possible to obtain the excellent effect of suppressing a loss in the optical waveguide type photodiode having a field confinement structure.

BEST MODE FOR CARRYING OUT THE INVENTION

The embodiments of the present invention will now be described with reference to the accompanying drawings.

First Embodiment

Figure 1A:
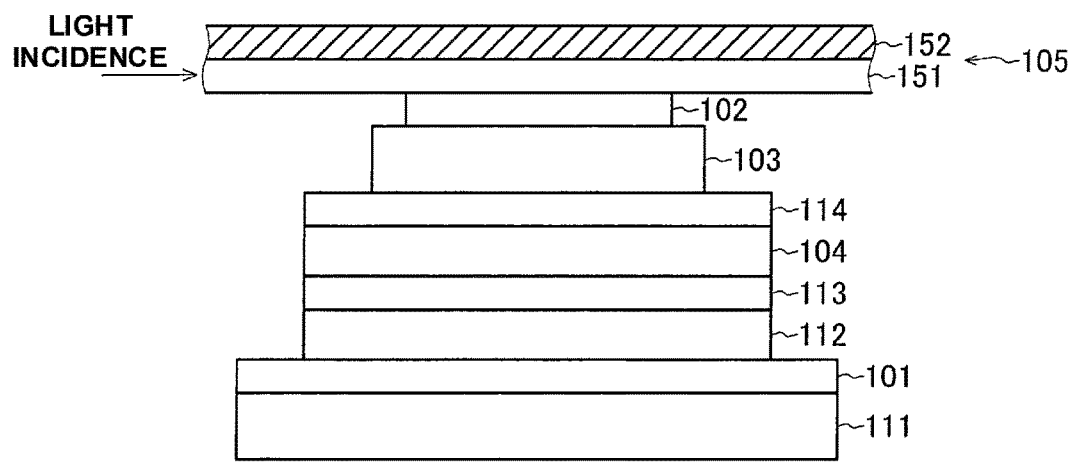
FIG. 1A is a sectional view showing the arrangement of an optical waveguide integrated light receiving element according to the first embodiment of the present invention.
Figure 1B:
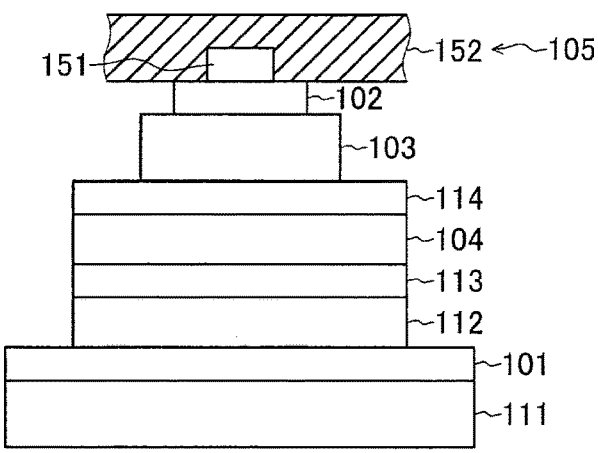
FIG. 1B is a sectional view showing the arrangement of the optical waveguide integrated light receiving element according to the first embodiment of the present invention.
Figure 1C:
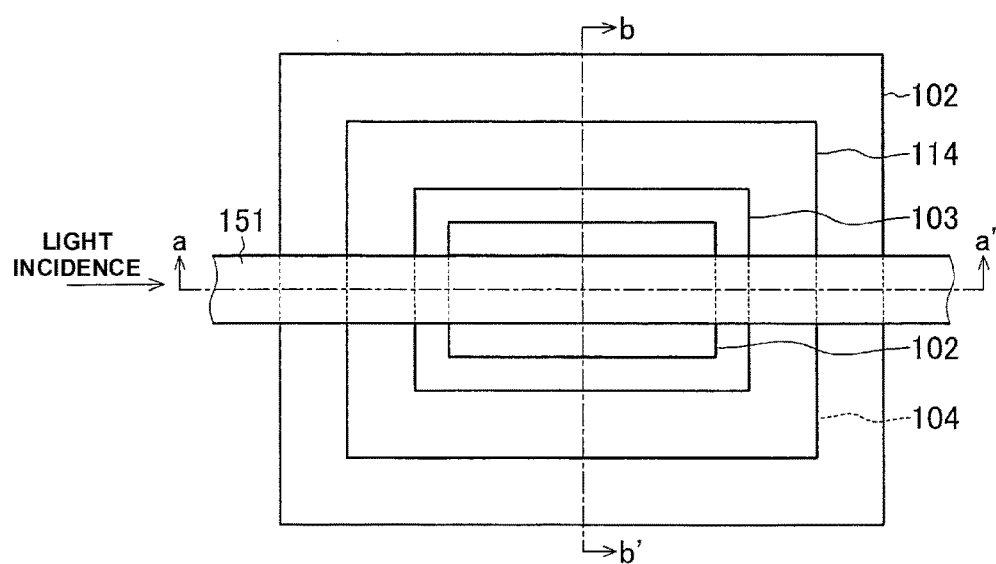
FIG. 1C is a plan view showing the arrangement of a part of the optical waveguide integrated light receiving element according to the first embodiment of the present invention.

The first embodiment of the present invention will be described first with reference to FIGS. 1A, 1B, and 1C. FIGS. 1A and 1B are sectional views showing the arrangement of an optical waveguide integrated light receiving element according to the first embodiment of the present invention. FIG. 1C is a plan view showing the arrangement of a part of the optical waveguide integrated light receiving element according to the first embodiment of the present invention. FIG. 1A shows a section taken along a line a-a' in FIG. 1C, and FIG. 1B shows a section taken along a line b-b' in FIG. 1C.

This optical waveguide integrated light receiving element includes a first contact layer 101 made of a compound semiconductor of a first conductivity type, and a second contact layer 102 made of a compound semiconductor of a second conductivity type. The optical waveguide integrated light receiving element also includes a light absorption layer 103 formed between the first contact layer 101 and the second contact layer 102. The light absorption layer 103 is made of a compound semiconductor. In addition, the optical waveguide integrated light receiving element includes a multiplication layer 104 formed between the first contact layer 101 and the second contact layer 102. The multiplication layer 104 is made of a compound semiconductor. In the light receiving element according to the first embodiment, the multiplication layer 104 is formed between the first contact layer 101 and the light absorption layer 103. Note that an electrode connected to the first contact layer 101 and an electrode connected to the second contact layer 102 are not illustrated in FIG. 1.

In addition, the optical waveguide integrated light receiving element includes an optical waveguide 105 that is arranged on a side of the second contact layer 102 opposite to the side where the light absorption layer 103 is arranged, and is optically coupled with the second contact layer 102. The waveguide direction of the optical waveguide 105 is parallel to the plane of the main surface of the light absorption layer 103. In the first embodiment, the optical waveguide 105 includes a ridge-type core 151 and a clad 152. In FIG. 1C, the clad 152 is not illustrated. Here, FIG. 1A shows a section of the plane parallel to the waveguide direction of the optical waveguide 105. In addition, FIG. 1B shows a section perpendicular to the waveguide direction of the optical waveguide 105.

In the above-described arrangement, in the first embodiment, the second contact layer 102 has, in a planar view, the size of an area smaller than that of the light absorption layer 103, and arranged inside the light absorption layer 103 in the planar view. In other words, when viewed from the normal direction of a surface parallel to the plane of the main surface of each layer, the second contact layer 102 is formed to have an area smaller than that of the light absorption layer 103 and arranged inner side of the light absorption layer 103. The light receiving element according to the first embodiment obtains a field confinement effect by arranging the second contact layer 102 as described above. The effective operation area is controlled by the area of the second contact layer 102 in the planar view.

Note that the multiplication layer 104 is sandwiched between a field control layer 113 of the first conductivity type and a field control layer 114 of the second conductivity type in the stacking direction. In addition, an electron transit layer 112 is formed between the multiplication layer 104 (field control layer 113) and the first contact layer 101. The above-described layers are stacked on a substrate 111. The light receiving element is formed by the first contact layer 101, the electron transit layer 112, the field control layer 113, the multiplication layer 104, the field control layer 114, the light absorption layer 103, and the second contact layer 102.

Note that as shown in FIG. 1C, in the planar view, the mesa of the light absorption layer 103 is formed so as to have an area smaller than that of a mesa formed by the electron transit layer 112 including the multiplication layer 104, the field control layer 113, and the field control layer 114. Additionally, as described above, in the planar view, the mesa of the second contact layer 102 is formed so as to have an area smaller than that of the mesa of the light absorption layer 103.

For example, the substrate 111 is made of InP. The first contact layer 101 is made of InAlGaAs (n-InAlGaAs) doped with an n-type impurity. The second contact layer 102 is made of InP (p-InP) doped with a p-type impurity. The light absorption layer 103 is made of InGaAs with a composition for absorbing target light. The multiplication layer 104 is made of InAlAs. In this embodiment, the first conductivity type is the n-type, and the second conductivity type is the p-type. In this arrangement, the multiplication layer 104 is arranged between the light absorption layer 103 and the first contact layer 101.

In addition, the electron transit layer 112 is made of InP. The field control layer 113 is made of InAlAs (n-InAlAs) doped with an n-type impurity. The field control layer 114 is made of InAlAs (p-InAlAs) doped with a p-type impurity. The core 151 is made of silicon, and the clad 152 is made of silicon oxide.

To produce the above-described optical waveguide integrated light receiving element, first, the above-described compound semiconductors are crystal-grown and stacked on the substrate 111 by, for example, well-known metal-organic chemical vapor deposition, molecular beam epitaxy, or the like. Next, the layers are patterned into mesa shapes by a known lithography technology and etching technology, thereby producing the light receiving element. In addition, the optical waveguide 105 is separately produced on a waveguide substrate, and the waveguide substrate and the light receiving element are bonded (wafer-bonding), thereby obtaining the optical waveguide integrated light receiving element according to the first embodiment.

The optical waveguide integrated light receiving element according to the first embodiment with the above arrangement is a so-called "evanescent coupling type" light receiving element. Input signal light passed through the optical waveguide 105 changes to an evanescent wave generated between the optical waveguide 105 and the second contact layer 102, propagates through the second contact layer 102, and is propagated to and absorbed by the light absorption layer 103. Of photocarriers generated in the light absorption layer 103, holes flow to the second contact layer 102, and electrons undergo avalanche multiplication by the multiplication layer 104 and reach the first contact layer 101.

In the first embodiment, the optical coupling point between the optical waveguide 105 and the light receiving element is the second contact layer 102 having the effect of field confinement on the light receiving element side. The optical waveguide 105 is spatially separated from the light absorption layer 103. The optical waveguide 105 is optically coupled with the light absorption layer 103 not directly but only via the second contact layer 102 that has the effect of field confinement.

Since the above-described arrangement is formed, in the first embodiment, light absorption does not occur in the light absorption layer 103 in a region other than the operation region (the formation region of the second contact layer 102 or a region immediately under the second contact layer 102) even in the element structure of an avalanche photodiode (APD) considering the field confinement effect. In addition, a part of the input signal light passed through the optical waveguide 105 changes to an evanescent wave, propagates through the second contact layer 102, enters the light absorption layer 103, and absorbed. All photocarriers generated by this behave as effective carriers.

As described above, according to the first embodiment, an APD that has a high speed/high sensitivity but can ensure reliability is implemented. Note that in the first embodiment, a ridge-type optical waveguide has been exemplified as the optical waveguide 105, and an APD having a multistage mesa structure has been exemplified as the APD element. However, the present invention is not limited to this. For example, a rib type or slab type optical waveguide may be used as the optical waveguide. In addition, the APD is not limited to the multistage mesa structure, and a structure using selective doping such as ion implantation or selective diffusion may be used.

Second Embodiment

Figure 2:
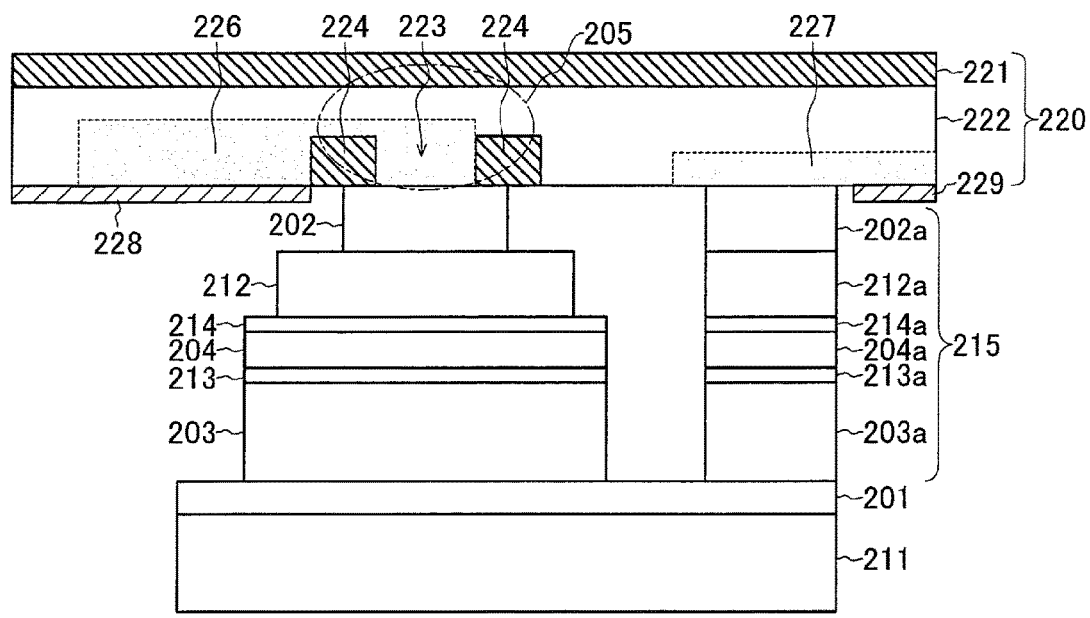
FIG. 2 is a sectional view showing the arrangement of an optical waveguide integrated light receiving element according to the second embodiment of the present invention.

The second embodiment of the present invention will be described next with reference to FIG. 2. FIG. 2 is a sectional view showing the arrangement of an optical waveguide integrated light receiving element according to the second embodiment of the present invention.

This optical waveguide integrated light receiving element includes a first contact layer 201 made of a compound semiconductor of a first conductivity type, and a second contact layer 202 made of a compound semiconductor of a second conductivity type. The optical waveguide integrated light receiving element also includes a light absorption layer 203 formed between the first contact layer 201 and the second contact layer 202. The light absorption layer 203 is made of a compound semiconductor. In addition, the optical waveguide integrated light receiving element includes a multiplication layer 204 formed between the first contact layer 201 and the second contact layer 202. The multiplication layer 204 is made of a compound semiconductor. In the light receiving element according to the second embodiment, the multiplication layer 204 is formed between the first contact layer 201 and the light absorption layer 203.

In addition, the optical waveguide integrated light receiving element includes an optical waveguide 205 that is arranged on a side of the second contact layer 202 opposite to the side where the light absorption layer 203 is arranged, has a waveguide direction parallel to the plane of the main surface of the light absorption layer 203, and is optically coupled with the second contact layer 202. In the second embodiment, the optical waveguide 205 is formed on an optical waveguide substrate 220 and includes a rib-type core 223 and a clad 224. FIG. 2 shows a section perpendicular to the waveguide direction of the optical waveguide 205.

In the second embodiment, a part of a silicon layer 222 formed on an insulating layer 221 that forms the optical waveguide substrate 220 is patterned, thereby forming the rib-type optical waveguide 205. In the region of the optical waveguide 205, the insulating layer 221 functions as a clad. The optical waveguide substrate 220 can be made of, for example, a well-known SOI (Silicon On Insulator) substrate. The buried insulating layer of the SOI substrate is the insulating layer 221, and the surface silicon layer is the silicon layer 222. In the silicon layer 222, a trench is formed in a region that becomes the clad 224 by a known lithography technology and etching technology. The trench is filled with silicon oxide by a known deposition technology, thereby forming the optical waveguide 205.

In the above-described arrangement, in the second embodiment, the second contact layer 202 has, in a planar view, a size of an area smaller than that of the light absorption layer 203, and arranged inside the light absorption layer 203 in the planar view. Even in the light receiving element according to the second embodiment, a field confinement effect is obtained by arranging the second contact layer 202 as described above. The effective operation area is controlled by the area of the second contact layer 202 in the planar view.

Note that the multiplication layer 204 is sandwiched between a field control layer 213 of the first conductivity type and a field control layer 214 of the second conductivity type in the stacking direction. In addition, an electron transit layer 212 is formed between the multiplication layer 204 (field control layer 213) and the first contact layer 201. The above-described layers are stacked on a substrate 211. The light receiving element is formed by the first contact layer 201, the electron transit layer 212, the field control layer 213, the multiplication layer 204, the field control layer 214, the light absorption layer 203, and the second contact layer 202.

Note that in the second embodiment, in the planar view, the mesa of the electron transit layer 212 is formed so as to have an area smaller than that of a mesa formed by the field control layer 213 including the multiplication layer 204, the field control layer 214, and the light absorption layer 203. Additionally, as described above, the mesa of the second contact layer 202 is formed so as to have an area smaller than that of the mesa of the light absorption layer 203 in the planar view.

In addition, a current path portion 215 is formed by the stacked structure of a first semiconductor layer 203a, a second semiconductor layer 213a, a third semiconductor layer 204a, a fourth semiconductor layer 214a, a fifth semiconductor layer 212a, and a sixth semiconductor layer 202a. The sixth semiconductor layer 202a of the current path portion 215 is connected to a contact region arranged in a predetermined region of the silicon layer 222 of the optical waveguide substrate 220.

Here, the first semiconductor layer 203a is formed from the same layer as the light absorption layer 203. In addition, the second semiconductor layer 213a is formed from the same layer as the field control layer 213. The third semiconductor layer 204a is formed from the same layer as the multiplication layer 204. The fourth semiconductor layer 214a is formed from the same layer as the field control layer 214. The fifth semiconductor layer 212a is formed from the same layer as the electron transit layer 212. The sixth semiconductor layer 202a is formed from the same layer as the second contact layer 202.

Additionally, in the second embodiment, an impurity introduction region 226 is formed in the silicon layer 222 of the optical waveguide substrate 220 from the optical coupling region with the second contact layer 202 to the contact region with an electrode 228. In addition, an impurity introduction region 227 is formed in the silicon layer 222 from the contact region with the sixth semiconductor layer 202a of the current path portion 215 to the contact region with an electrode 229. The impurity introduction regions 226 and 227 are formed by selective ion implantation.

For example, the substrate 211 is made of InP. The first contact layer 201 is made of InAlGaAs (p-InAlGaAs) doped with a p-type impurity. The second contact layer 202 (sixth semiconductor layer 202a) is made of InP (n-InP) doped with an n-type impurity. The light absorption layer 203 (first semiconductor layer 203a) is made of InGaAs with a composition for absorbing target light. The multiplication layer 204 (third semiconductor layer 204a) is made of InAlAs. In this case, the first conductivity type is the p-type, and the second conductivity type is the n-type. In this arrangement, the multiplication layer 204 is arranged between the light absorption layer 203 and the second contact layer 202.

In addition, the electron transit layer 212 (fifth semiconductor layer 212a) is made of InP. The field control layer 213 (second semiconductor layer 213a) is made of InAlAs (p-InAlAs) doped with a p-type impurity. The field control layer 214 (fourth semiconductor layer 214a) is made of InAlAs (n-InAlAs) doped with an n-type impurity.

To produce the above-described optical waveguide integrated light receiving element, first, the above-described compound semiconductors are crystal-grown and stacked on the substrate 211 by, for example, well-known metal-organic chemical vapor deposition, molecular beam epitaxy, or the like. Next, the layers are patterned into mesa shapes by a known lithography technology and etching technology, thereby producing the light receiving element and the current path portion 215. The substrate 211 on which the light receiving element and the current path portion 215 are formed and the optical waveguide substrate 220 on which the optical waveguide 205 is formed are bonded and integrated, thereby obtaining the optical waveguide integrated light receiving element according to the second embodiment. At this time, the substrate 211 and the optical waveguide substrate 220 are aligned and joined such that the positions of the second contact layer 202 and the sixth semiconductor layer 202a match the positions of the contact regions of the silicon layer 222 corresponding to them. In the alignment, well-known alignment marks are used. In addition, to join the substrate 211 and the optical waveguide substrate 220, general surface activation jointing is used.

In the optical waveguide integrated light receiving element according to the second embodiment with the above arrangement, input signal light passed through the optical waveguide 205 changes to an evanescent wave generated between the optical waveguide 205 and the second contact layer 202, propagates through the second contact layer 202, enters the light absorption layer 203, and is absorbed.

Of photocarriers generated in the light absorption layer 203, holes immediately reach the first contact layer 201, pass through the current path portion 215, and reach the electrode 229 via the impurity introduction region 227 of the optical waveguide substrate 220. This also applies to holes generated in the multiplication layer 204.

On the other hand, of the photocarriers generated in the light absorption layer 203, electrons undergo avalanche multiplication by the multiplication layer 204, flow to the second contact layer 202, reach the core 223, and pass through the impurity introduction region 226 of the optical waveguide substrate 220, thereby reaching the electrode 228.

In the second embodiment as well, the optical coupling point between the optical waveguide 205 and the light receiving element is the second contact layer 202 having the effect of field confinement on the light receiving element side. The optical waveguide 205 is spatially separated from the light absorption layer 203. The optical waveguide 205 is optically coupled with the light absorption layer 203 not directly but only via the second contact layer 202 that has the effect of field confinement.

Additionally, in the second embodiment, a special wiring process for forming a wiring or electrode on the side of the substrate 211 on which the light receiving element is formed need not be performed, and electric wiring can easily be formed on the optical waveguide substrate 220.

Third Embodiment

Figure 3:
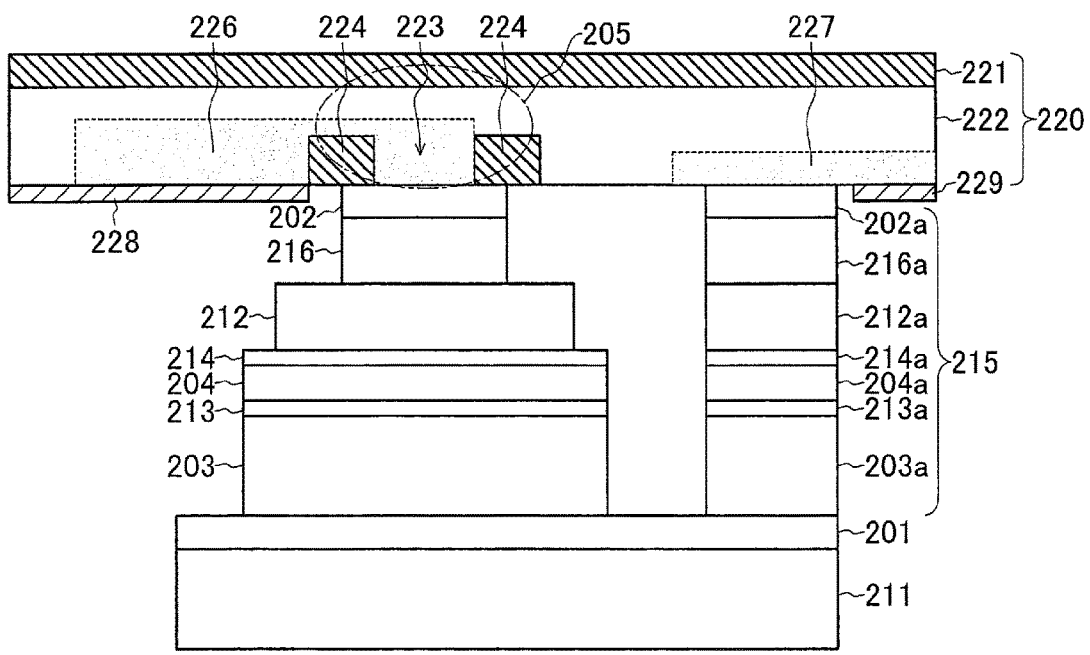
FIG. 3 is a sectional view showing the arrangement of an optical waveguide integrated light receiving element according to the third embodiment of the present invention.

The third embodiment of the present invention will be described next with reference to FIG. 3. FIG. 3 is a sectional view showing the arrangement of an optical waveguide integrated light receiving element according to the third embodiment of the present invention.

This optical waveguide integrated light receiving element includes a first contact layer 201 made of a compound semiconductor of a first conductivity type, and a second contact layer 202 made of a compound semiconductor of a second conductivity type. The optical waveguide integrated light receiving element also includes a light absorption layer 203 formed between the first contact layer 201 and the second contact layer 202. The light absorption layer 203 is made of a compound semiconductor. In addition, the optical waveguide integrated light receiving element includes a multiplication layer 204 formed between the first contact layer 201 and the second contact layer 202. The multiplication layer 204 is made of a compound semiconductor. The multiplication layer 204 is formed between the first contact layer 201 and the light absorption layer 203.

In addition, the optical waveguide integrated light receiving element includes an optical waveguide 205 that is arranged on a side of the second contact layer 202 opposite to the side where the light absorption layer 203 is arranged, has a waveguide direction parallel to the plane of the main surface of the light absorption layer 203, and is optically coupled with the second contact layer 202. In the third embodiment, the optical waveguide 205 is formed on an optical waveguide substrate 220 and includes a rib-type core 223 and a clad 224. FIG. 3 shows a section perpendicular to the waveguide direction of the optical waveguide 205.

Note that a part of a silicon layer 222 formed on an insulating layer 221 that forms the optical waveguide substrate 220 is patterned, thereby forming the rib-type optical waveguide 205. In the region of the optical waveguide 205, the insulating layer 221 functions as a clad.

In addition, the second contact layer 202 has, in a planar view, a size of an area smaller than that of the light absorption layer 203, and arranged inside the light absorption layer 203 in the planar view. Even in the light receiving element according to the third embodiment, a field confinement effect is obtained by the second contact layer 202. The effective operation area is controlled by the area of the second contact layer 202 in the planar view.

In addition, the multiplication layer 204 is sandwiched between a field control layer 213 of the first conductivity type and a field control layer 214 of the second conductivity type in the stacking direction. In addition, an electron transit layer 212 is formed between the multiplication layer 204 (field control layer 213) and the first contact layer 201. The above-described layers are stacked on a substrate 211. The light receiving element is formed by the first contact layer 201, the electron transit layer 212, the field control layer 213, the multiplication layer 204, the field control layer 214, the light absorption layer 203, and the second contact layer 202.

Note that the mesa of the electron transit layer 212 is, in the planar view, formed so as to have an area smaller than that of a mesa formed by the field control layer 213 including the multiplication layer 204, the field control layer 214, and the light absorption layer 203. Additionally, as described above, the mesa of the second contact layer 202 is formed so as to have an area smaller than that of the mesa of the light absorption layer 203 in the planar view.

In addition, a current path portion 215 is formed by the stacked structure of a first semiconductor layer 203a, a second semiconductor layer 213a, a third semiconductor layer 204a, a fourth semiconductor layer 214a, a fifth semiconductor layer 212a, and a sixth semiconductor layer 202a. The sixth semiconductor layer 202a of the current path portion 215 is connected to a contact region arranged in a predetermined region of the silicon layer 222 of the optical waveguide substrate 220.

Here, the first semiconductor layer 203a is formed from the same layer as the light absorption layer 203. In addition, the second semiconductor layer 213a is formed from the same layer as the field control layer 213. The third semiconductor layer 204a is formed from the same layer as the multiplication layer 204. The fourth semiconductor layer 214a is formed from the same layer as the field control layer 214. The fifth semiconductor layer 212a is formed from the same layer as the electron transit layer 212. The sixth semiconductor layer 202a is formed from the same layer as the second contact layer 202.

Additionally, in the third embodiment, an impurity introduction region 226 is formed in the silicon layer 222 of the optical waveguide substrate 220 from the optical coupling region with the second contact layer 202 to the contact region with an electrode 228. In addition, an impurity introduction region 227 is formed in the silicon layer 222 from the contact region with the sixth semiconductor layer 202a of the current path portion 215 to the contact region with an electrode 229.

The above arrangement is the same as in the above-described second embodiment. In the third embodiment, an optical matching layer 216 (seventh semiconductor layer 216a) is provided between the second contact layer 202 (sixth semiconductor layer 202a) and the electron transit layer 212 (fifth semiconductor layer 212a).

The optical matching layer 216 will be described below. When evanescent light is propagated from the optical waveguide 205 to the light absorption layer 203 via the second contact layer 202, local light absorption is not generated as much as in the butt coupling type. However, in a region where optical coupling starts, concentration of a photocurrent caused by concentration of predetermined light absorption occurs. Such local photocurrent concentration not only degrades the reliability of the APD but also may remarkably deteriorate the linearity of the electrical output intensity to the optical input intensity of the APD in accordance with a local space charge effect in the light absorption layer 203 (see non-patent literature 7).

To prevent the above-described local concentration of light absorption, it is effective to lower the efficiency of optical coupling by the evanescent light between the optical waveguide 205 and the light absorption layer 203. When the layer thickness of each semiconductor layer existing between the optical waveguide 205 and the light absorption layer 203 is appropriately designed, the optical coupling efficiency between the optical waveguide 205 and the light absorption layer 203 can be controlled.

However, changing the layer thickness of the multiplication layer 204 or the electron transit layer 212 influences the gain-band product (GBP) or travel band of the APD. To give predetermined band performance to the APD, these layer thicknesses cannot arbitrarily be designed. Note that the travel band is f3 dB (intrinsic f3 dB) decided by the travel time of a carrier.

In the third embodiment, the optical matching layer 216 of the same conductivity type as the second contact layer 202 is inserted in an appropriate layer thickness in the mesa of the second contact layer 202 coupled with the optical waveguide 205, thereby controlling the above-described optical coupling efficiency.

The optical matching layer 216 has the same conductivity type as the second contact layer 202, and therefore, hardly influences the carrier travel time because the carrier moves from the optical matching layer 216 to the second contact layer 202 by dielectric relaxation when it reaches the optical matching layer 216. Hence, even when the layer thickness of the optical matching layer 216 is designed to obtain an arbitrary optical coupling efficiency between the optical waveguide 205 and the light absorption layer 203, it does not influence the operation speed.

In addition, the doping concentration in the optical matching layer 216 is equal to or less than that in the second contact layer 202. This suppresses free carrier absorption in the optical matching layer 216 and enables more efficient optical coupling with the light absorption layer 203. As a result, in the third embodiment as well, a high speed/high sensitivity and high reliability can simultaneously be implemented, as in the above-described first and second embodiments. In addition, according to the third embodiment, it is possible to suppress deterioration of linearity caused by concentration of a photocurrent.

Fourth Embodiment

Figure 4:
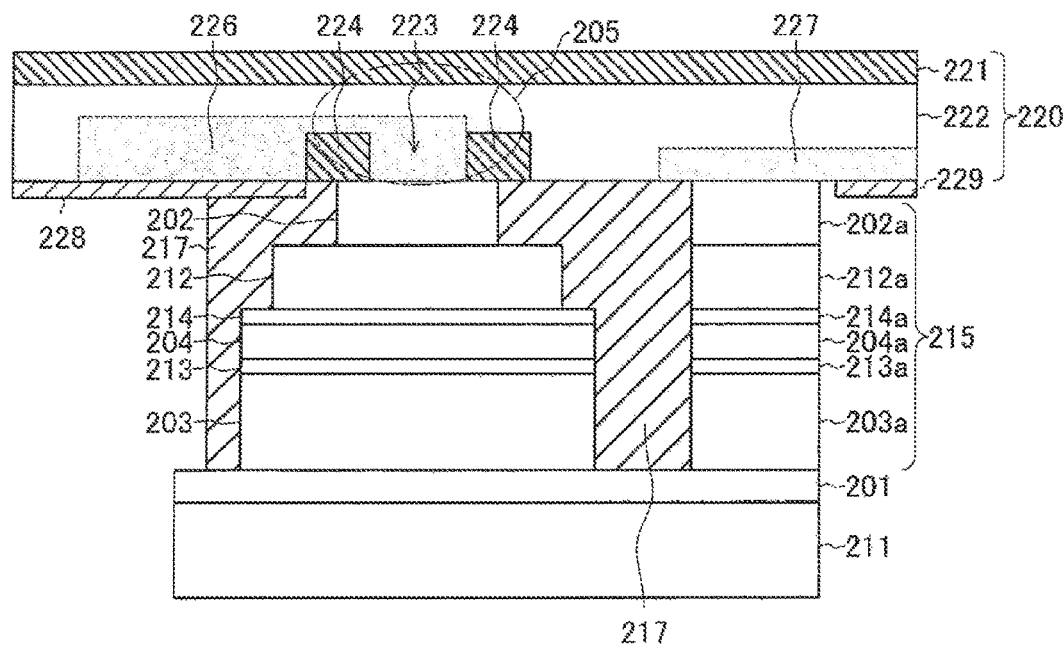
FIG. 4 is a sectional view showing the arrangement of an optical waveguide integrated light receiving element according to the fourth embodiment of the present invention.
Figure 5:
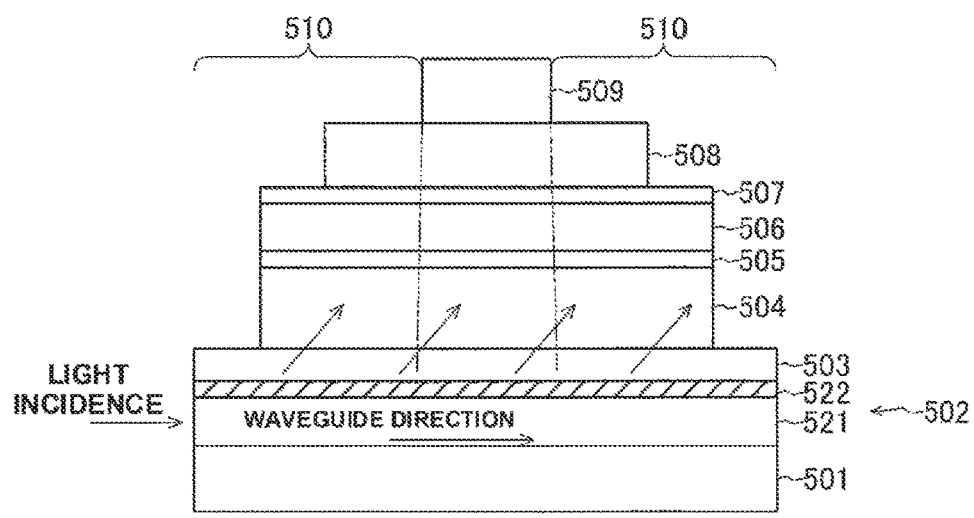
FIG. 5 is a sectional view showing the arrangement of a conventional optical waveguide integrated light receiving element.

The fourth embodiment of the present invention will be described next with reference to FIG. 4. FIG. 4 is a sectional view showing the arrangement of an optical waveguide integrated light receiving element according to the fourth embodiment of the present invention.

This optical waveguide integrated light receiving element includes a first contact layer 201 made of a compound semiconductor of a first conductivity type, and a second contact layer 202 made of a compound semiconductor of a second conductivity type. The optical waveguide integrated light receiving element also includes a light absorption layer 203 formed between the first contact layer 201 and the second contact layer 202. The light absorption layer 203 is made of a compound semiconductor. In addition, the optical waveguide integrated light receiving element includes a multiplication layer 204 formed between the first contact layer 201 and the second contact layer 202. The multiplication layer 204 is made of a compound semiconductor. In addition, the multiplication layer 204 is formed between the first contact layer 201 and the light absorption layer 203.

In addition, the optical waveguide integrated light receiving element includes an optical waveguide 205 that is arranged on a side of the second contact layer 202 opposite to the side where the light absorption layer 203 is arranged, has a waveguide direction parallel to the plane of the main surface of the light absorption layer 203, and is optically coupled with the second contact layer 202. In the fourth embodiment, the optical waveguide 205 is formed on an optical waveguide substrate 220 and includes a rib-type core 223 and a clad 224. FIG. 4 shows a section perpendicular to the waveguide direction of the optical waveguide 205.

Note that a part of a silicon layer 222 formed on an insulating layer 221 that forms the optical waveguide substrate 220 is patterned, thereby forming the rib-type optical waveguide 205. In the region of the optical waveguide 205, the insulating layer 221 functions as a clad.

Furthermore, the second contact layer 202 has, in a planar view, a size of an area smaller than that of the light absorption layer 203, and arranged inside the light absorption layer 203 in the planar view. Even in the light receiving element according to the fourth embodiment, a field confinement effect is obtained by arranging the second contact layer 202 as described above. The effective operation area is controlled by the area of the second contact layer 202 in the planar view.

In addition, the multiplication layer 204 is sandwiched between a field control layer 213 of the first conductivity type and a field control layer 214 of the second conductivity type in the stacking direction. In addition, an electron transit layer 212 is formed between the multiplication layer 204 (field control layer 213) and the first contact layer 201. The above-described layers are stacked on a substrate 211. The light receiving element is formed by the first contact layer 201, the electron transit layer 212, the field control layer 213, the multiplication layer 204, the field control layer 214, the light absorption layer 203, and the second contact layer 202.

Note that the mesa of the electron transit layer 212 is, in the planar view, formed so as to have an area smaller than that of a mesa formed by the field control layer 213 including the multiplication layer 204, the field control layer 214, and the light absorption layer 203. Additionally, as described above, the mesa of the second contact layer 202 is formed so as to have an area smaller than that of the mesa of the light absorption layer 203 in the planar view.

In addition, a current path portion 215 is formed by the stacked structure of a first semiconductor layer 203a, a second semiconductor layer 213a, a third semiconductor layer 204a, a fourth semiconductor layer 214a, a fifth semiconductor layer 212a, and a sixth semiconductor layer 202a. The sixth semiconductor layer 202a of the current path portion 215 is connected to a contact region (impurity introduction region 227) near an electrode 229 of the silicon layer 222 of the optical waveguide substrate 220.

Here, the first semiconductor layer 203a is formed from the same layer as the light absorption layer 203. In addition, the second semiconductor layer 213a is formed from the same layer as the field control layer 213. The third semiconductor layer 204a is formed from the same layer as the multiplication layer 204. The fourth semiconductor layer 214a is formed from the same layer as the field control layer 214. The fifth semiconductor layer 212a is formed from the same layer as the electron transit layer 212. The sixth semiconductor layer 202a is formed from the same layer as the second contact layer 202.

Additionally, in the fourth embodiment, an impurity introduction region 226 is formed in the silicon layer 222 of the optical waveguide substrate 220 from a region optically coupled with the second contact layer 202 to a region in contact with an electrode 228. In addition, the impurity introduction region 227 is formed in the silicon layer 222 from a region in contact with the sixth semiconductor layer 202a of the current path portion 215 to a region in contact with the electrode 229.

The above arrangement is the same as in the above-described second embodiment. In the fourth embodiment, a passivation layer 217 that covers the side surfaces of the light receiving element is provided. The refractive index of the passivation layer 217 is lower than the refractive index of the semiconductor material that forms the light receiving element. More specifically, $SiO_2$ suffices.

In the fourth embodiment as well, as the basic operation principle, signal light incident from the optical waveguide 205 is optically coupled with the second contact layer 202 that becomes a field confinement portion in the light receiving element thereby efficiently inputting the signal light to the light absorption layer 203, as in the above-described second and third embodiments.

However, depending on the atmosphere on the side surfaces or the upper surface of the light receiving element or the material used for the passivation layer 217, the signal light received in the light receiving element may leak out to the outside of the light receiving element. In particular, in the smallest mesa of the light receiving element, a mode may occur even outside the mesa depending on the coupling mode of the light. In this case, since the light that leaks out to the outside of the mesa is a loss, a desired light responsivity cannot be obtained.

As is known well, the passivation layer 217 is important to protect the portion of the light receiving element from the actual use environment or the like. However, the above-described light leakage to the outside of the mesa conspicuously occurs when the refractive index difference between the semiconductor material that forms the light receiving element and the material that forms the passivation layer 217 is small.

Hence, the passivation layer 217 is made of a material of a lower refractive index such that a large refractive index difference is obtained with respect to the semiconductor material that forms the light receiving element. This enables suppression of light leakage from the light receiving element and more efficient input of incident light from the optical waveguide 205 to the light absorption layer 203 even when the passivation layer 217 is formed to protect the light receiving element.

As described above, according to the present invention, the second contact layer arranged on the side of the optical waveguide is formed such that the area of the second contact layer is smaller than that of the light absorption layer in a planar view, and arranged inside the light absorption layer in the planar view. Hence, the electric field of the element is narrowed by the second contact layer having the smallest area. That is, the region immediately under the second contact layer corresponds to the effective operation region of the element in the planar view. Signal light from the waveguide is propagated to the light absorption layer via the second contact layer. Hence, according to the present invention, it is possible to suppress a loss in the optical waveguide type photodiode having a field confinement structure.

Note that the present invention is not limited to the above-described embodiments, and many modifications and combinations can obviously be executed by those who have normal knowledge in this field without departing from the technical scope of the present invention.

For example, as the semiconductor that forms the light receiving element, III-V semiconductors such as InP, InGaAs, and InAlAs have been exemplified above. However, the present invention is not limited to these. In addition, the material that forms the optical waveguide is not limited to silicon and silicon oxide.

A case in which the light receiving element and the optical waveguide substrate are integrated by wafer-bonding has been described as an example. However, the present invention is not limited to this. For example, silicon and germanium may be used as the semiconductors that form the light receiving element, and the light receiving element may be monolithically produced on the optical waveguide substrate by a silicon core. Alternatively, InP may be used as the material that forms the optical waveguide, and the light receiving element may be monolithically produced on the optical waveguide substrate.

Furthermore, appropriately applying a reflecting layer or an antireflection layer to the incident portion to the optical waveguide or an end of the light absorption layer falls under the category of general design items and does not lose the generality of the present invention. In addition, employing an arbitrary layer in the contact layer or between the multiplication layer and the light absorption layer from the viewpoint of reduction of an ohmic resistance or band alignment does not damage the generality of the present invention, and is a design item applied to general semiconductor devices.

Additionally, in the example for explaining the present invention, each of the p- and n-type contact layers is formed by a layer of one type. However, the present invention is not limited to this. In actuality, to obtain satisfactory crystal quality while reducing the sheet resistance and the contact resistance of the contact layer, a contact layer is sometimes formed by a plurality of layers. For example, the contact layer is formed by a main contact layer having a large layer thickness and a relatively low impurity concentration and a sub-contact layer having a small layer thickness and a high impurity concentration. The main contact layer is a layer configured to reduce the sheet resistance and ensure satisfactory crystal quality. For example, the thickness is set to several hundred nm, and the impurity concentration is set to a level of 18th power. In addition, the sub-contact layer is a layer that is in direct contact with a metal. To reduce the contact resistance and ensure satisfactory crystal quality, the thickness is set to several ten nm, and the impurity concentration is set to a level of 19th power. Even when the contact layer includes such a plurality of layers, the generality of the present invention is not lost.

EXPLANATION OF THE REFERENCE NUMERALS AND SIGNS

101 . . . first contact layer, 102 . . . second contact layer, 103 . . . light absorption layer, 104 . . . multiplication layer, 105 . . . optical waveguide, 111 . . . substrate, 112 . . . electron transit layer, 113 . . . field control layer, 114 . . . field control layer, 151 . . . core, 152 . . . clad.

The invention claimed is:

1. An optical waveguide integrated light receiving element comprising:
   a first contact layer made of a compound semiconductor of a first conductivity type;
   a second contact layer made of a compound semiconductor of a second conductivity type;
   a light absorption layer made of a compound semiconductor and formed between the first contact layer and the second contact layer;
   a multiplication layer made of a compound semiconductor and formed between the light absorption layer and one of the first contact layer and the second contact layer; and
   an optical waveguide arranged on a side of the second contact layer opposite to a side where the light absorption layer is arranged, having a waveguide direction parallel to a plane of the light absorption layer, and optically coupled with the second contact layer,
   wherein the second contact layer has, in a planar view, a size of an area smaller than that of the light absorption layer, and arranged inside the light absorption layer in the planar view.

2. The optical waveguide integrated light receiving element according to claim 1, further comprising an optical matching layer of the second conductivity type that is formed in contact with the side of the second contact layer where the light absorption layer is arranged, and
   an impurity concentration of the optical matching layer is equal to or less than an impurity concentration of the second contact layer.

3. The optical waveguide integrated light receiving element according to claim 1, further comprising a passivation layer configured to cover a side portion of a light receiving element including the first contact layer, the second contact layer, the light absorption layer, and the multiplication layer, and
   the passivation layer has a refractive index lower than that of a semiconductor that forms the light receiving element.

4. A method of manufacturing an optical waveguide integrated light receiving element, comprising:
- a first step of producing, on a substrate, a light receiving element including:
- a first contact layer made of a compound semiconductor of a first conductivity type;
- a second contact layer made of a compound semiconductor of a second conductivity type;
- a light absorption layer made of a compound semiconductor and formed between the first contact layer and the second contact layer; and
- a multiplication layer made of a compound semiconductor and formed between the light absorption layer and one of the first contact layer and the second contact layer,
- wherein the second contact layer has, in a planar view, a size of an area smaller than that of the light absorption layer, and arranged inside the light absorption layer;
- a second step of producing an optical waveguide substrate including an optical waveguide; and
- a third step of wafer-bonding the substrate and the optical waveguide substrate and obtaining a state in which the optical waveguide is arranged on a side of the second contact layer opposite to a side where the light absorption layer is arranged, the optical waveguide has a waveguide direction parallel to a plane of the light absorption layer, and is optically coupled with the second contact layer.

5. The optical waveguide integrated light receiving element according to claim 2, further comprising a passivation layer configured to cover a side portion of a light receiving element including the first contact layer, the second contact layer, the light absorption layer, and the multiplication layer, and
- the passivation layer has a refractive index lower than that of a semiconductor that forms the light receiving element.

* * * * *